United States Patent
Rad et al.

(10) Patent No.: US 8,473,806 B1
(45) Date of Patent: *Jun. 25, 2013

(54) LAYERED QUASI-CYCLIC LDPC DECODER WITH REDUCED-COMPLEXITY CIRCULAR SHIFTER

(75) Inventors: Farshid Rafiee Rad, San Francisco, CA (US); Nedeljko Varnica, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/615,411

(22) Filed: Sep. 13, 2012

Related U.S. Application Data

(63) Continuation of application No. 12/471,085, filed on May 22, 2009, now Pat. No. 8,291,283.

(60) Provisional application No. 61/059,478, filed on Jun. 6, 2008.

(51) Int. Cl.
*H03M 13/00* (2006.01)

(52) U.S. Cl.
USPC ............ 714/752; 714/786; 714/801; 714/805

(58) Field of Classification Search
USPC .................. 714/752, 786, 801, 805
See application file for complete search history.

(56) References Cited

U.S. PATENT DOCUMENTS

| | | | | |
|---|---|---|---|---|
| 7,484,159 B2 * | 1/2009 | Kan et al. | | 714/755 |
| 7,499,490 B2 | 3/2009 | Divsalar et al. | | |
| 7,506,238 B2 | 3/2009 | Hocevar | | |
| 7,525,801 B2 | 4/2009 | Luo | | |
| 7,543,212 B2 * | 6/2009 | Miles et al. | | 714/752 |
| 7,627,805 B2 | 12/2009 | Mittelsteadt et al. | | |
| 7,719,442 B2 | 5/2010 | Liu et al. | | |
| 7,752,520 B2 | 7/2010 | Xia | | |
| 7,831,895 B2 * | 11/2010 | Lin | | 714/800 |
| 7,877,664 B2 | 1/2011 | Kyung et al. | | |
| 7,890,844 B2 | 2/2011 | Jeong et al. | | |
| 7,900,127 B2 * | 3/2011 | Shen et al. | | 714/804 |
| 8,010,870 B2 | 8/2011 | Yokokawa et al. | | |
| 8,069,390 B2 * | 11/2011 | Lin | | 714/758 |
| 8,103,935 B2 * | 1/2012 | Matsumoto et al. | | 714/758 |
| 8,205,131 B2 * | 6/2012 | Oh et al. | | 714/752 |

* cited by examiner

*Primary Examiner* — Esaw Abraham

(57) ABSTRACT

This disclosure relates generally to data decoding, and more particularly to iterative decoders for data encoded with a low-density parity check (LDPC) encoder. LDPC decoders are disclosed that use reduced-complexity circular shifters that may be used to decode predefined or designed QC-LDPC codes. In addition, methods to design codes which may have particular LDPC code performance capabilities and which may operate with such decoders using reduced-complexity circular shifters are provided. The generation of quasi-cyclic low density parity check codes and the use of circular shifters by LDPC decoders, may be done in such a way as to provide increased computational efficiency, decreased routing congestion, easier timing closure, and improved application performance.

20 Claims, 13 Drawing Sheets

US 8,473,806 B1

LAYERED QUASI-CYCLIC LDPC DECODER WITH REDUCED-COMPLEXITY CIRCULAR SHIFTER

CROSS-REFERENCE TO RELATED APPLICATIONS

This application is a continuation of U.S. patent application Ser. No. 12/471,085, now U.S. Pat. No. 8,291,283, filed May 22, 2009, which claims the benefit under 35 U.S.C. §119(e) of U.S. Provisional Application No. 61/059,478, filed Jun. 6, 2008, each of which is hereby incorporated by reference herein in its entirety.

BACKGROUND OF THE DISCLOSURE

This disclosure relates generally to data decoding, and more particularly to iterative decoders for data encoded with a low-density parity check (LDPC) encoder.

LDPC codes may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

As used herein, the term message refers to a numerical value, usually representing a log likelihood ratio (LLR). A LDPC decoder may decode LDPC codes using an iterative message passing algorithm, such as a min-sum decoding algorithm. Such algorithms may decode a received codeword using an iterative process in which each iteration includes two update steps involving check nodes and variable nodes.

A LDPC decoder may also use a layered approach to decoding (layered decoding) to decode LDPC codes. For a QC-LDPC code with a quasi-cyclic parity check matrix consisting of circular submatrices (circulants) of size $S_c$, the number of check node processors necessary to implement layered decoding in the LDPC decoder may be $S_c$. This quantity is the parallelization level. Within a LDPC decoder, the layered decoding approach for a QC-LDPC codeword may require a circular shifter to be used. The circular shifter may be responsible for shifting $S_c$ LLR messages, each from a different check node processor, in one layer of processing. The amount of shift may be determined by the maximum shift necessary for a message. At greatest, the maximum shift may be equal to, $S_c$, the size of the circulants in the quasi-cyclic parity check matrix associated with the QC-LDPC code. In this case, a $S_c$ input, $S_c$ output circular shifter may be used to appropriately shift the LLR messages. This $S_c \times S_c$ circular shifter may be implemented using a barrel shifter that hierarchically shifts the input sequence of each of the LLR messages in $\text{ceil}(\log_2(S_c))$ steps. The complexity of this circular shifter may therefore be proportional to $\text{ceil}(\log_2(S_c))$.

The LLR messages may also have to be initially shifted prior to the start of the initial messages sent to a LDPC decoder by, for example, a channel detector. In particular, these LLR messages may be the initial messages sent to a group of (grouped) variable nodes associated with a circulant of a quasi-cyclic parity check matrix in a mother matrix representation. Prior to the start of the decoding process, these messages may have to be appropriately shifted so that the computation and subsequent shifting of messages sent from the variable nodes to the check nodes is correct. The amount that the LLR messages must be shifted may be determined by the difference in shifts between the first non-zero circulant in the column associated with the grouped variable nodes to which the LLR messages are sent and the previous non-zero circulant in the same column of the quasi-cyclic parity check matrix in the mother matrix representation. LLR messages may be sent from, for example, a channel detector to a layered LDPC decoder in segments smaller than circulant size, $S_c$. LLR messages may be sent in this manner because of the bandwidth constraints in the channel between a channel detector and a layered LDPC decoder. Subsequent shifting of LLR messages may be done by the circular shifter used in layered decoding.

The performance capability of a coding scheme, such as a LDPC coding scheme, is often described by the code's performance curve. The performance curve is a plot of signal-to-noise ratios (SNR) vs. Bit Error Rate (BER), or equivalently Sector Error Rate (SER). A tradeoff may exist between the performance of a QC-LDPC code, predefined or designed, and the complexity of the circular shifter used in layered decoding of the QC-LDPC code.

In terms of complexity, the circular shifter used in decoding a QC-LDPC code, predefined or designed, may be one of the dominant modules which may, depending on the size of the code, comprise 20-30% of the total complexity of the LDPC decoder. A highly complex circular shifter may nominally increase the performance of a predefined or designed QC-LDPC code, but may disadvantageously lead to computational inefficiency, increased routing congestion and more difficult timing closure. Moreover, such computational inefficiency, increased routing congestion, and more difficult timing closure may lead to degraded application performance.

Therefore, there exists a need for LDPC decoders using circular shifters of reduced complexity which decode predefined or designed QC-LDPC codes. Furthermore, there exists a need to have methods to design codes which may have particular LDPC code performance capabilities and which may operate with such decoders using reduced-complexity circular shifters. Moreover, there exists a need to appropriately shift LLRs prior to the start of the layered decoding approach used by such decoders using reduced-complexity circular shifters. For example, decoding predefined or designed QC-LDPC codes using LDPC decoders with reduced-complexity circular shifters that limit the amount of shift to a small value may acceptably decrease the LDPC code performance capability and may lead to increased computational efficiency, decreased routing congestion, and easier timing closure. Therefore, there exists a need, for example, for LDPC decoders which use reduced-complexity circular shifters that limit the amount of shift to a small value. There also exists a need, for example, for designed QC-LDPC codes which may have particular LDPC code performance capabilities and which may be decoded using LDPC decoders using reduced complexity circular shifters. Increased computational efficiency, decreased routing congestion, and easier timing closure of these types of decoders may lead to improved application performance.

SUMMARY OF THE DISCLOSURE

Accordingly, LDPC decoders are disclosed that use reduced-complexity circular shifters that may be used to decode predefined or designed QC-LDPC codes. In addition, methods are disclosed to design codes which may have particular LDPC code performance capabilities and which may operate with such decoders using reduced-complexity circular shifters. The generation of quasi-cyclic low density parity check codes and the use of circular shifters by LDPC decoders, according to this disclosure, may provide increased computational efficiency, decreased routing congestion, easier timing closure, and improved application performance.

Embodiments are provided that have circular shifters, which include data inputs, shifting circuitry, control inputs, and data outputs. The data inputs may be used to receive an input message. For example, this may be a received vector, v, received from a communications channel after demodulation. The shifting circuitry may have a predetermined number of shifting steps. For example, this may be determined using a maximum of all entries of a delta shift matrix which may be a matrix generated from a quasi-cyclic parity check matrix in a mother matrix representation. The control inputs may be used to select an amount of shift to be applied to the input message by the shifting circuitry. This shift amount may be determined using the entries in the quasi-cyclic parity check matrix in a mother matrix representation. The data outputs may output the input message shifted by the amount of shift.

Embodiments are also provided that are used to satisfy particular code performance requirements using a threshold value. In these embodiments, a threshold value may be initialized. A quasi-cyclic low density parity check (QC-LDPC) code may be determined based on the threshold value. For example, this may be done by using a constraint, based on the threshold, to select shift values for circulant entries in a quasi-cyclic parity check matrix in a mother matrix representation. The performance of the code may be verified to satisfy particular code performance requirements. The threshold value may then be incremented if the threshold value does not equal the circulant size. The shift values for circulant entries in the quasi-cyclic parity check matrix in a mother matrix representation may be selected to allow a corresponding delta shift matrix to have shift values below the threshold.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Systems and methods are provided for enhancing the performance of layered LDPC decoders of quasi-cyclic low-density parity check QC-LDPC codes. In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
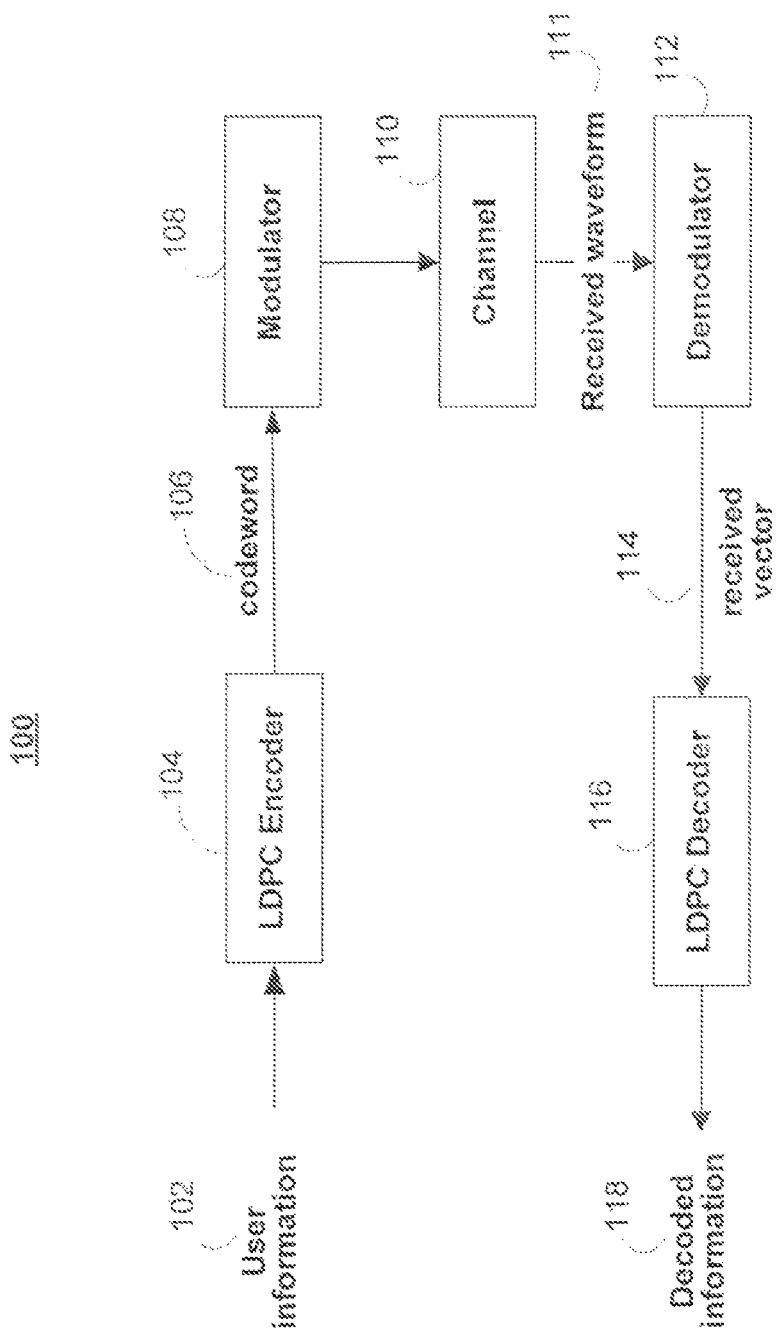
FIG. 1 shows an illustrative block diagram of an error-correcting communication/storage system in accordance with some embodiments.

FIG. 1 shows an illustrative communication or data storage system 100 that utilizes error-correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be refereed to as n, where $n \geq k$.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by LDPC decoder 116. LDPC decoder 116 may be used to correct or detect errors in received vector 114. LDPC decoder 116 may use a circular shifter. A circular shifter may be used by LDPC decoder 116 to decode a quasi-cyclic LDPC code. LDPC decoder 116 may also use an iterative message-passing algorithm or layered decoding to correct or detect errors in received vector 114. LDPC decoder 116 may calculate a log-likelihood-ratio (LLR) message (also known as soft information). For example, LDPC decoder 116 may compute a LLR message using the equation $$LLR(b_i) = \log\left(\frac{P(b_i = 0)}{P(b_i = 1)}\right)$$

for each i, where $b_i$ may represent the $i^{th}$ bit in received vector 114. LDPC decoder 116 may use the computed LLR messages in the message passing algorithm or in layered decoding. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit, which may be any suitable predetermined number. When LDPC decoder 116 reaches the maximum iteration limit, LDPC decoder 116 may automatically terminate operation and move on to the next received vector 114. However, if the output of LDPC decoder 116 successfully converges to a valid iterative codeword, LDPC decoder 116 may then output decoded information 118.

Figure 2:
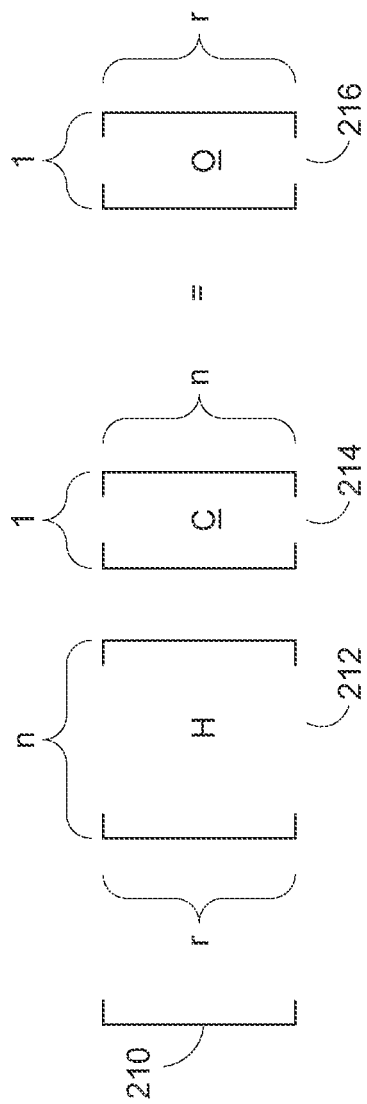
FIG. 2 shows an illustrative example of the properties of a codeword in accordance with some embodiments.

FIG. 2 shows an illustrative example of the properties of codeword 106 of FIG. 1 in accordance with some embodiments. The LDPC codes processed by encoder 104 of FIG. 1 and LDPC decoder 116 of FIG. 1 are conventionally represented by mathematical vector models. In particular, an LDPC code may be described by its parity check matrix H. Equation 210 illustrates parity check matrix 212. Parity check matrix 212 may be o f size [r×n], corresponding to codewords of length n and syndromes of length r. Codewords may be, for example, n-length codeword 106 or n-length received vector 114 of FIG. 1. Syndrome length r may satisfy the inequality r≧n−k where k is the length of the information being encoded (e.g., length of user information 102 of FIG. 1). When parity check matrix 212 is multiplied by codeword 214, the result is zero-vector 216, which is a vector of size [r×1] where all elements equal zero. Parity check matrix 212 has a maximum column weight (cw) defined to be the maximum of the set of the number of nonzero entries in each column of parity check matrix 212. Parity check matrix 212 is not unique, and may be chosen, for example, to be computationally convenient and/or to decrease the number of errors generated by the message passing algorithm in LDPC decoder 116. As discussed in relation to FIG. 1, codeword 214 may be decoded in LDPC decoder 116 to produce decoded information 118.

Figure 3:
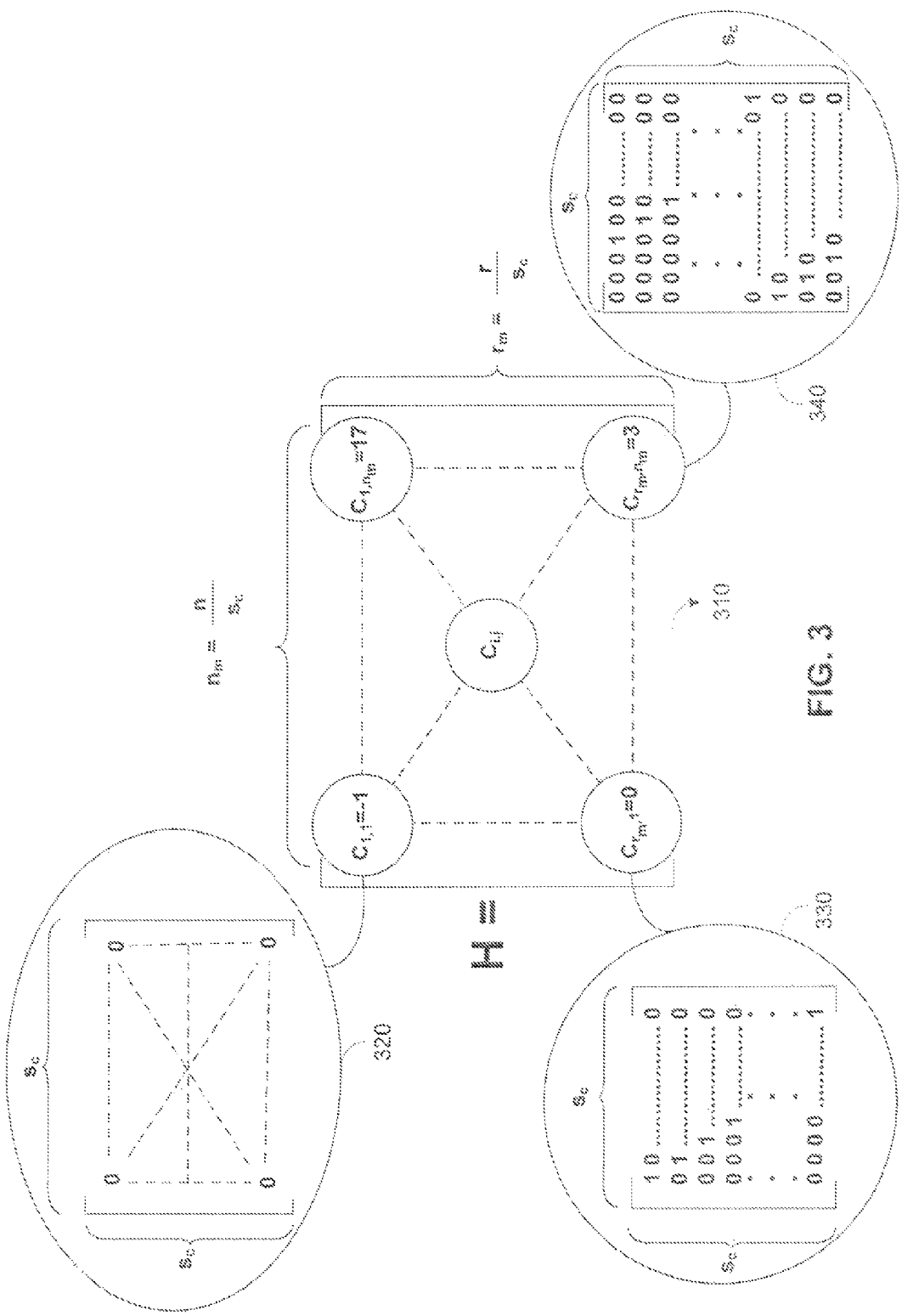
FIG. 3 shows an illustrative example of a quasi-cyclic parity check matrix in a mother matrix representation in accordance with some embodiments.

FIG. 3 shows an illustration example of quasi-cyclic parity check matrix 310 in a mother matrix representation in accordance with some embodiments. A mother matrix representation is a compact way for describing a matrix that may contain a large number of elements. The mother matrix representation is equivalent to the normal matrix representation, but may be advantageous in illustrating the structure of a possibly large matrix without the necessity of explicitly listing each element in the matrix.

A quasi-cyclic code representation is defined by the characteristic that the parity check matrix for that particular code is quasi-cyclic. A quasi-cyclic parity check matrix in a mother matrix representation may be made up of circular submatrices known as circulants. Circulant 340 is one such matrix. Circulant 340 is a square matrix—i.e. circulant 340 has the same number of rows as columns. This number is commonly referred to as the circulant size $S_c$. In addition, circulants have the property that for any given positive integer $C_{i,j} < S_c$, any row/column of the circulant matrix may be cyclically shifted by $C_{i,j}$ positions to obtain another row/column. The value of each non-negative integer in quasi-cyclic parity check matrix 310 specifies the corresponding circulant submatrix in terms of a "shift," $C_{i,j}$, relative to the identity matrix. For example, the number zero represent identity matrix 330 of size $S_c$, and the number three represents matrix 340 which is identity matrix 330 with each row cyclically shifted to the right by three positions. As a matter of notation, minus-one denotes the all-zero matrix 320. For brevity, the phrase "non-zero circulant" will be used to refer any circulant matrix that is not the all-zero matrix. Recall that parity check matrix 310 is of size [r×n]. Thus, the size of the mother matrix is $[r_m=r/S_c \times n_m=n/S_c]$, where $S_c$, r, and n are chosen so that $r_m$ and $n_m$ are integers.

If a quasi-cyclic representation of parity check matrix is used, then the implementation of LDPC encoder 104 and of LDPC decoder 116, may be significantly simplified. One reason for this is that parity check matrix 310 may be much easier to store, since only the first row/column of each circulant matrix needs to be stored in order to generate the entire circulant. If the circulant is sparse (has low row/column weight) then it may be stored by simply storing the positions of the one-bits in its first row (or first column). Furthermore by using a quasi-cyclic representation of parity check matrix, the storage of the messages used during the decoding of a LDPC vector within LDPC decoders may also be made more compact and parallelization in the encoder/decoder may be achievable with simple shifting operations, since adjacent rows (or adjacent columns) corresponding to the same circulant are cyclic shifts of each other. In addition, for some quasi-cyclic LDPC codes, encoding and decoding can be further simplified by efficient address-generation.

Figure 4:
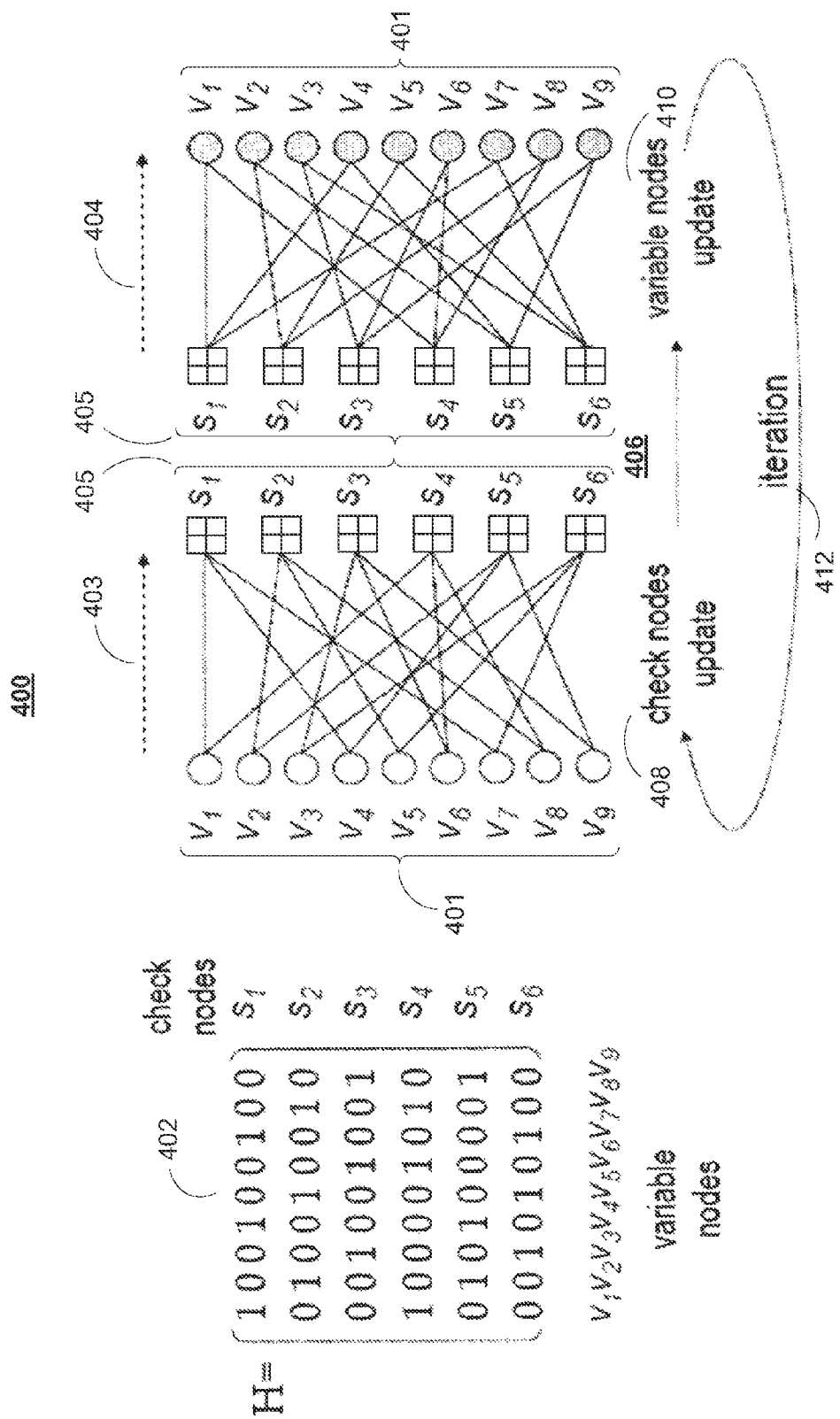
FIG. 4 shows a graphical illustration of a parity check matrix and iterative message passing algorithm corresponding to the parity check matrix in accordance with some embodiments.

FIG. 4 shows graphical illustration 400 of a parity check matrix and iterative message passing algorithm corresponding to the parity check matrix in accordance with some embodiments. An LDPC code may be graphically represented by a Tanner graph, a bipartite graph showing the relationship between a LDPC code's codeword bits and parity check equations. The advantages of using a Tanner graph of a LDPC code may include access to efficient graph-based message-passing algorithms for decoding. There are two types of nodes shown in Tanner graphs 403 and 404. Variable nodes 401 represent each position in codeword 106 and are denoted by circles. Thus, there may be n variable nodes. Variable nodes may also be referred to as symbol or bit nodes. Check nodes 405 may represent each syndrome (parity check equation) of LDPC code. For example, there may be n–k check nodes. Check nodes are denoted by squares.

Tanner graphs 403 and 404 correspond to parity check matrix 402. The check nodes and variable nodes of Tanner graphs 403 and 404 may correspond to the rows and columns of parity check matrix 402, respectively. The undirected edges connecting check nodes with variable nodes may correspond to the locations of the non-zero entries of parity check matrix 402. In other words, parity check matrix 402 may be the adjacency matrix of Tanner graphs 403 and 404. For example, the 1 at the (1,1) location and the 0 at the (1,2) location of parity check matrix 402 may indicate that there is an edge between check node $S_1$ and variable node $V_1$, and that there is no edge between check node $S_1$ and variable node $V_2$, respectively. Therefore, if there are $d_v$ "1"'s in a given column of parity check matrix 402, then there are $d_v$ edges emanating from the variable node corresponding to that column. Equivalently, the variable node corresponding to that column may have a degree of $d_v$. Similarly, if there are $d_c$ "1"'s in some given row of parity check matrix 402, then there may be $d_c$ edges emanating from the check node corresponding to that row. Equivalently, the check node corresponding to that row may have a degree of $d_c$.

The check nodes (e.g. check nodes 405) of a Tanner graph may either be satisfied or unsatisfied, where a satisfied node has a binary value of 0 and an unsatisfied node has a binary value of 1. A check node may be satisfied (i.e., equal to 0), if the values of the variable nodes connected to the check node sum to an even number. In other words, the value of each check node may be equal to the sum modulo two of the value of the variable nodes to which it is connected. For example, check node $S_2$ of Tanner graphs 403 and 404 may be satisfied if the values of variable nodes $V_2$, $V_5$, and $V_8$ sum to an even number. Furthermore, when a check node is unsatisfied, at least one of the variable nodes connected to it may be in error. Thus, the value of the check nodes (or equivalently, the value of the syndrome produced by parity check matrix 402) may provide a parity check on each codeword received by a LDPC decoder (i.e., LDPC decoder 116 of FIG. 1), thereby providing error correction capability to communication/storage system 100 of FIG. 1.

Tanner graphs 403 and 404 may be used to illustrate an iterative two-step decoding algorithm known as message passing algorithm 406 employed by, for example, LDPC decoder 116 of FIG. 1. The message passing algorithm may perform several rounds (or iterations) of message updates in accordance with the structure of the Tanner graph associated with the parity check matrix of the LDPC codes to be decoded.

The message passing update steps in message passing algorithm 406 employed by, for example LDPC decoder 116, may be scheduled in multiple ways. For example, each iteration 412 of message passing algorithm 406) may include processing several check nodes. For example, in the first iteration, some of the check nodes 405 (for example, check nodes $S_1$ and $S_2$) may request that some of variable nodes 401, to which they are connected, send their current messages to these check nodes. Check nodes $S_1$ and $S_2$ may then perform update 408 by carrying out computations based on the messages that they receive and a set of update rules. Then, check nodes $S_1$ and $S_2$ may send their current messages to the variable nodes to which they are connected. The variable nodes connected to check nodes $S_1$ and $S_2$ (i.e. variable nodes $V_1$, $V_4$, $V_7$ and nodes $V_2$, $V_5$ and $V_8$) may then perform update 410 by carrying out computations based on the messages that they receive and a set of update rules.

Then, for example, in the next iteration, some of the check nodes 405 (for example, check nodes $S_3$ and $S_4$) may request that the variable nodes connected to these check node sent their current messages to these check nodes. Check nodes $S_3$ and $S_4$ may then perform update 408 by carrying out computations based on the messages that they receive and a set of update rules. Then, check nodes $S_3$ and $S_4$ may send their current messages to the variable nodes to which they are connected. Variable nodes connected to check nodes $S_3$ and $S_4$ (i.e. nodes $V_3$, $V_6$, $V_9$ and $V_1$, $V_6$ and $V_8$) may then perform update 410 by carrying out computations based on the messages that they receive and a set of update rules. The same process may be repeated for check nodes $S_5$ and $S_6$.

Iteration 412 may be repeated until either the codeword has been decoded or until a threshold number of iterations has been reached. The messages that are sent during each step of each iteration of message passing algorithm 406 may depend on the update rules and the scheduling of the update steps.

Prior to the first iteration of message passing algorithm 406, each of the variable nodes 402 of FIG. 4 may receive an LLR message based on information from received vector 114 of FIG. 4. As discussed above, each iteration of message passing algorithm 406 may include two steps. In the first step, check nodes may update and in the second step variable nodes may update. This process may be repeated until either the codeword has been decoded or until a threshold number of iterations has been reached.

For example, in the first step, a group of variable nodes within the set of variable nodes 401 may send their current messages to a group of check nodes (e.g. to be processed in the first layer of message passing decoding) within the set of check nodes 405 to which they are connected. The group of check nodes may then perform update 408 by carrying out computations based on the messages that they receive and a set of update rules. For example, these check nodes may receive $d_c$ messages each from a different variable node to which it is connected. Each message sent from the group of variable nodes to the group of check nodes may be labeled as a Q type message. Each a-posteriori probability (APP) message computed for the group of variable nodes may be labeled as P type message. Q type or P type messages may be stored in the LDPC decoder's memory. For example, these messages may be labeled $Q_1$ through $Q_{d_c}$. The group of check nodes may then update by computing a R type message using each Q type message it received and a min approximation. Specifically, using all of the Q type messages it received, each of the check nodes in the group of check nodes may comprise a R type message based on the equations $$\tanh\left(\frac{R}{2}\right) = \prod_{k=1}^{d_c-1} \tanh\left(\frac{Q_k}{2}\right)$$

which may be approximated using min approximation $$R \approx \min(Q_k, \ldots, Q_{d_c-1}) \prod_{k=1}^{d_c-1} \text{sign}(Q_k).$$

The $Q_k$ messages (i.e. a number k of Q type messages) may be read directly from the memory of the iterative decoder or may be reconstructed. The $Q_k$ messages may be reconstructed from the $P_k$ messages (i.e. a number k of P type messages) and the previous R type messages that may be read from the memory of the LDPC decoder. These newly computer R messages may be sent to each of the variable nodes to which the check node is connected.

In the second step, a group of check nodes within the set of check nodes 405 may send their current message to a group of variable nodes within the set of variable nodes 401 to which they are connected. The group of variable nodes may then perform update 410 by carrying out computations based on the messages that they receive and a set of update rules. For example, these variable nodes may receive $d_v$ messages each from different check nodes to which it is connected. Each message sent from the group of check nodes to the group of variable nodes may be labeled as a R type message. For example, the messages sent from check nodes to a variable node may be labeled $R_1$ through $R_{d_c}$. The group of variable nodes may then update by computing a Q type message using each R type message it received. Specifically, using the initially received LLR message, and each of the R type messages received, each variable node of the group of variable nodes may compute a Q type message based on the equation $$Q = LLR + \sum_{j=1}^{d_c-1} R_j.$$

Similarly, message update steps may be performed to compute a P type message (also known as an a-posteriori probability (APP) message). Using the initially received LLR message and each of the R type messages received, each varaible node of the group of variable nodes may compute a P type message 515 based on the equation:

$$P = LLR + \sum_{j=1}^{d_c} R_j.$$

In addition, each variable node of the group of variable nodes may also compute an extrinsic ($LLR_{EXT}$) message based on the equations:

$$LLR_{APP}(v) = LLR + \sum_{j=1}^{d_c} R_l$$

and $LLR_{EXT}(v) = LLR_{APP}(v) - LLR$. Some or all of these newly computed messages may be sent to each of the check nodes to which the variable node is connected.

The design of message passing algorithm 406 may be modified to decode a QC-LPDC code in a more efficient manner. In particular, the schedule of update steps in message passing algorithm 406 may be altered to exploit the quasi-cyclic nature of the parity check matrix associated with the QC-LDPC code. To decode a QC-LDPC code, message passing algorithm 406 may make use of a circular shifter.

Figure 5:
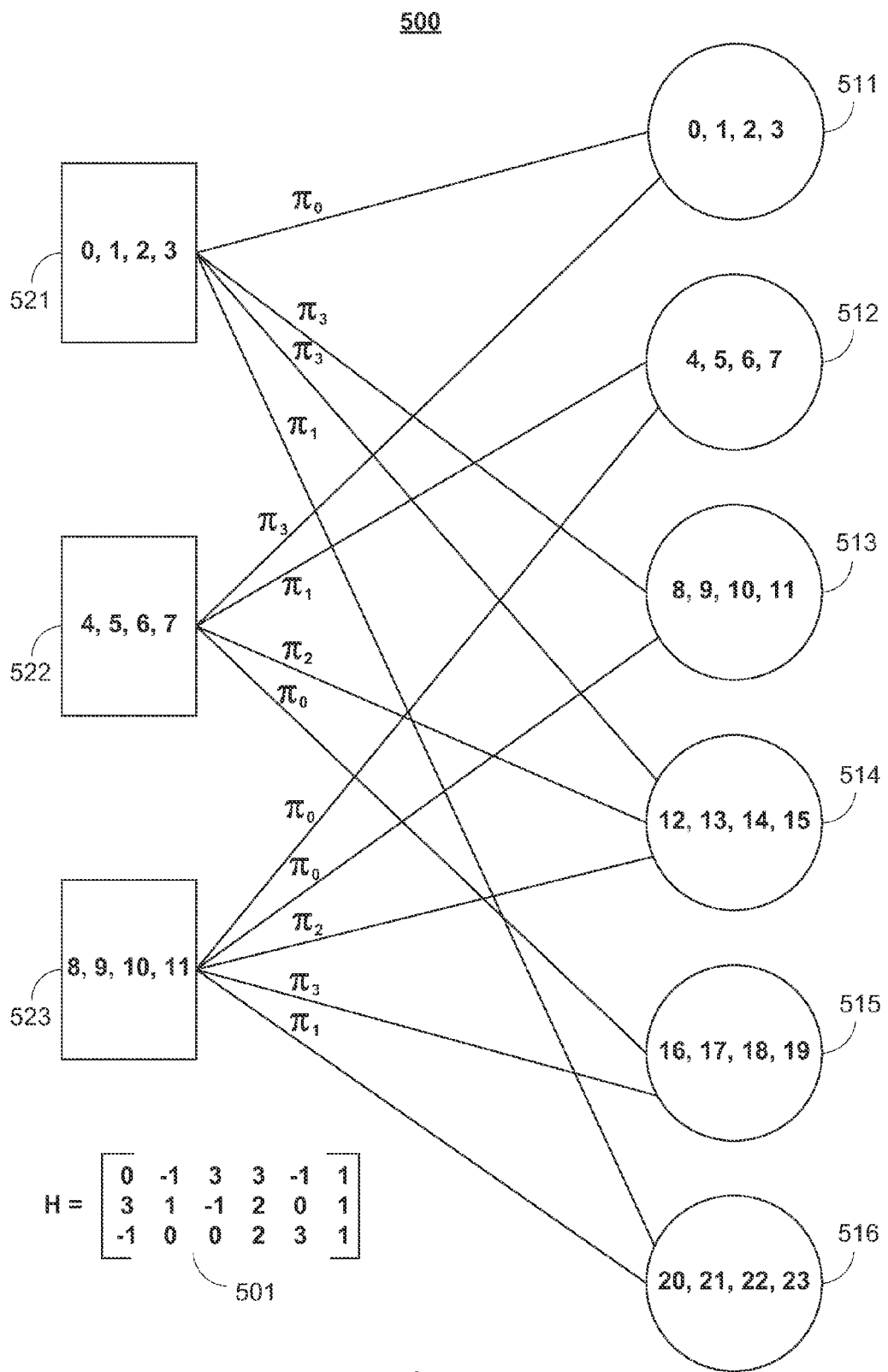
FIG. 5 shows a graphical illustration of a QC-LPDC code's quasi-cyclic parity check matrix in a mother matrix representation and a bi-partite graph illustrating the use of parallel processing in the layered approach used to decode the QC-LDPC code in accordance with some embodiments.

FIG. 5 shows graphical illustration 500 of a QC-LPDC code's quasi-cyclic parity check matrix 501 in a mother matrix representation and a bi-partite graph illustrating the use of parallel processing in the layered approach used to decode the QC-LDPC code in accordance with some embodiments. Graph 500 includes grouped check nodes 521, 522 and 523 and grouped variable nodes 511 512 513 514 515, and 516. The edges between the grouped check nodes and the grouped variable nodes may represent possible permutations, $\pi_1$, of a plurality of edges generated based on a non-zero circulant in quasi-cyclic parity check matrix 501. In other words, the non-zero circulant may be the adjacency matrix of the sub-graph of connections between each group of check nodes and each group of variable nodes. To decode a QC-LDPC code, particular layers or groups of check nodes may update in parallel. To accomplish this, check nodes associated with a particular row in quasi-cyclic parity check matrix 501, in a mother matrix representation, may be grouped together. This process may result in grouped check nodes 521, 522, and 523. For example, check nodes associated with the first four rows of the QC-LDPC code's parity check matrix, labeled 0, 1, 2, and 3, may be combined into grouped check nodes 521 and may be updated at substantially the same time (i.e. processed in parallel, for example, in the first layer of decoding). Variable nodes associated with a particular column in quasi-cyclic parity check matrix 501, in a mother matrix representation, may be grouped together. This process may result in grouped variable nodes 511 512 513 514 515, and 516.

Processing for and updating of all check nodes in grouped check nodes 521, 522, or 523 may be done in parallel. Similarly, processing for and updating of all variable nodes in grouped variable nodes 511 512 513 514 515, and 516 may also be done in parallel. The processing of neighboring grouped check nodes and grouped variable nodes in this way may allow for reduced-complexity circular shifter design. To decode a QC-LDPC code using layered decoding, the fundamental principles of message passing algorithm 406 of FIG. 4 may be used. This process of decoding a QC-LDPC code will be explained further below.

Figure 6:
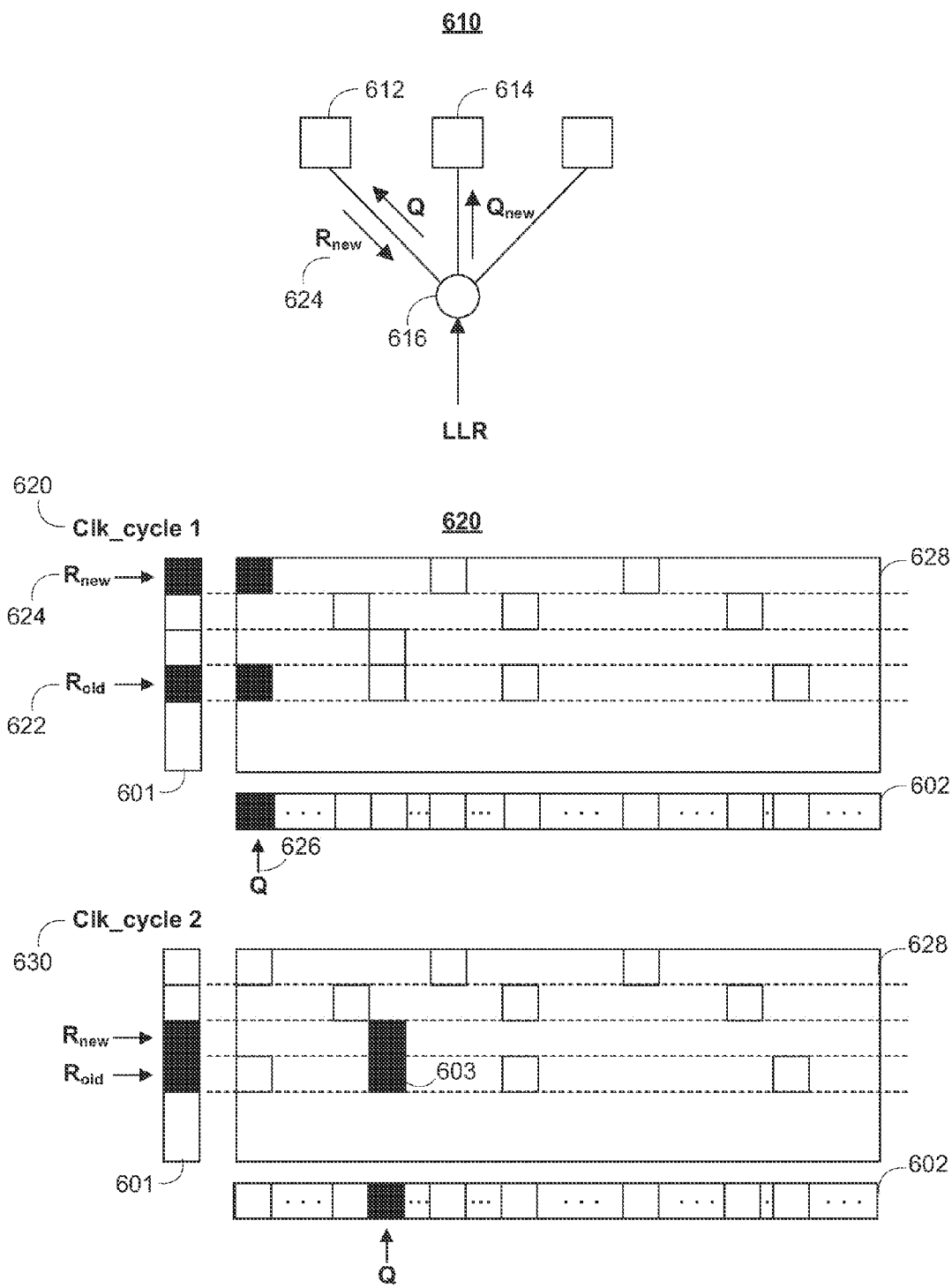
FIG. 6 shows a graphical illustration of the scheduling of update steps in the layered approach to decoding a QC-LDPC code and a graphical illustration of reading and writing from and to decoder memory when the update steps are performed in accordance with some embodiments.

FIG. 6 shows graphical illustration 610 of the scheduling of update steps in the layered approach to decoding a QC-LDPC code and graphical illustration 620 of reading and writing from and to decoder memory when the update steps are performed in accordance with some embodiments. In illustration 610, grouped varaible nodes 616 are denoted by a circle. In illustration 610 grouped check nodes 612 and grouped check nodes 614 are denoted by squares. Illustration 620 shows the reading and writing of R type and Q type messages from memory and to memory when layered decoding is used. Illustration 620 shows quasi-cyclic parity check matrix 628 in mother matrix representation. Illustration 620 shows R memory 601 and Q memory 602 associated with these parity check matrices. The organization of the memory locations in R memory 601 and Q memory 602 may be governed by a parity check matrix in a mother matrix representation.

Each square within R memory 601 may represent a memory location for data used to derive R type messages (e.g. R type messages 624 or R type messages 622) of grouped check nodes represented by a row of the quasi-cyclic parity check matrix in a mother matrix representation (e.g. parity check matrix 628). For example, each memory location may contain data values Min1 (M1), Min2 (M2), Min1Index, Min2Index, and AccumulatedSign. Min1 may correspond to the smallest value of the absolute value of all Q type messages associated with non-zero circulants in the corresponding row of the quasi-cyclic parity check matrix in a mother matrix representation and Min1Index may be the column location of this Q type message. Similarly, Min2 may correspond to the next smallest value of the absolute value of all Q type messages associated with non-zero circulants in the corresponding row of the quasi-cyclic parity check matrix in a mother matrix representation and Min2Index may be the column location of this Q type message. The value of AccumulatedSign is the product of the signs of all Q type messages associated with non-zero circulants in the corresponding row of the quasi-cyclic parity check matrix in a motor matrix representation. These data values may be used to derive an R type message (e.g. based on the min approximation discussed above). Each square within Q memory 602 may represent memory locations for the Q type or P type messages (e.g. Q type messages 626) of grouped variable nodes represented by a column of the quasi-cyclic parity check matrix in a mother matrix representation (e.g. parity check matrix 628). In performing the update steps in the layered approach to decoding a QC-LDPC code, messages may be read form or written to these memory locations.

Each row of quasi-cyclic parity check memory matrix 628 may correspond to both grouped check nodes as well as a layer to be processed during layered decoding. For example, during clock cycle 620 of layered decoding the fourth row of quasi-cyclic parity check matrix 628 may be processed. The data in the memory location corresponding to the fourth row of parity check matrix 628 may be read from R memory 601 and previous R type messages 622, $R_{old}$, may be derived from the stored data. Next, Q type messages 626 in the first column in Q memory 602 may be read from memory. These messages may be associated with the column containing the first non-zero circulant in the fourth row of parity check matrix 628. The data in the memory location corresponding to the first row of parity check matrix 628 may then be read from R memory 601 and R type messages 624, $R_{now}$, may be derived from this data. The first row of the first column of parity check matrix 628 may correspond to the first non-zero circulant previous to the non-zero circulant in the fourth row (the layer currently being processed) of the same column.

Using this information, each of the variable nodes in the grouped variable nodes associated with the first column of parity check matrix 628 may each compute a Q type or a P type message. For example, each of these variable nodes may compute the a-posteriori probability message $P:=Q+R_{new}$. These variable node may then compute $Q_{new}:=P-R_{old}$. Prior to computing $Q_{new}$, the computed P message may have to be circularly shifted to align the P and $R_{old}$ messages. This may be done, for example, using the circular shifter used by the layered LDPC decoder. The shift amount may be determined by the delta shift matrix and, in particular, the difference in shift between the first row and fourth row in the first column of parity check matrix 628. The delta shift matrix will be discussed further below.

The grouped variable nodes associated with the first column of parity check matrix 628 may then store the computed $Q_{new}$ messages in the associated location in Q memory 602. These $Q_{new}$ messages may be sent to the grouped check nodes associated with the fourth row of parity check matrix 628 (the current layer being processed). Using the $Q_{new}$ messages, these grouped check nodes may update and buffer the data values Min1 (M1), Min2 (M2), Min1Index, Min2Index, and AccumulatedSign. Processing may then continue in the clock cycle 630 using the values for Q type messages and $R_{old}$ messages associated with the column containing the second non-zero circulant in the fourth row of parity check matrix 628 (e.g. the column associated with circulant 603). At the end of processing the fourth layer the updated buffered values for Min1 (M1), Min2 (M2), Min1Index, Min2Index, and AccumulatedSign may be written to the associated location in R memory 601.

Figure 7:
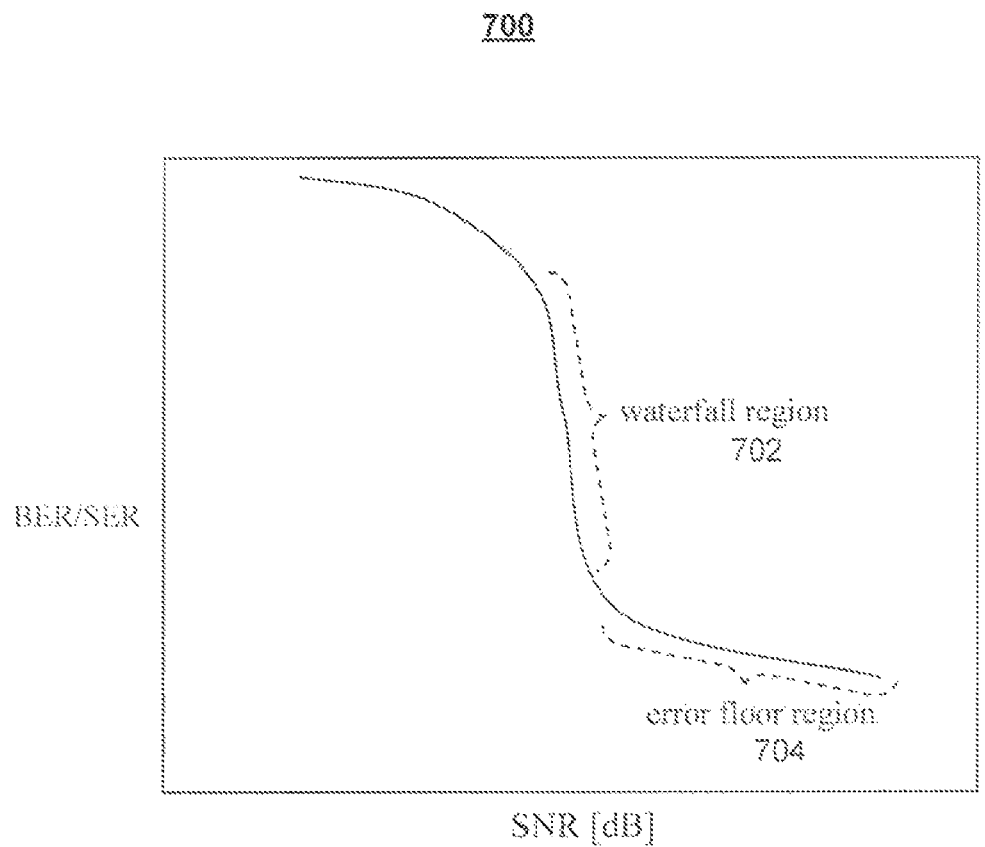
FIG. 7 shows an illustrative graph of regions of error at various signal to noise ratios in accordance with some embodiments.

FIG. 7 shows an illustrative graph of regions of error at various signal to noise ratios in accordance with some embodiments. The performance capability of LDPC codes, as described by a mapping of BER/SER to SNR, generally comprises two regions of operation: the waterfall region and the error floor region. FIG. 7 shows an exemplary LDPC performance curve 700 with waterfall region 702 and error floor region 704. In waterfall region 702, the code's BER or equivalently, SER, decreases rapidly with improvements in SNR. In error floor region 704, the BER/SER of the LDPC code improves only marginally as the channel conditions improve. Because he normal operating conditions for a communication/storage channel may be in error floor region 704, lowering the error floor may improve the performance of the LDPC code in terms of BER/SER.

As discussed above, there may be a tradeoff between the performance curve of a QC-LDPC code, predefined or designed, and the complexity of the circular shifter used in layered decoding of the QC-LDPC code. In particular, the performance of the QC-LDPC code in error floor region 704 may be traded-off for the complexity of the circular shifter. Moreover, the level of constraint in the design of a QC-LDPC code may be traded-off for the complexity of a circular shifter that may be used in decoding the QC-LDPC code. This will be discussed further below. The design of a QC-LDPC may be done by appropriately selecting a necessary code performance target and by appropriately selecting a desired complexity of the circular shifter to be used in the process of decoding the QC-LDPC code and designing the QC-LDPC code to meet these constraints.

Figure 8A:
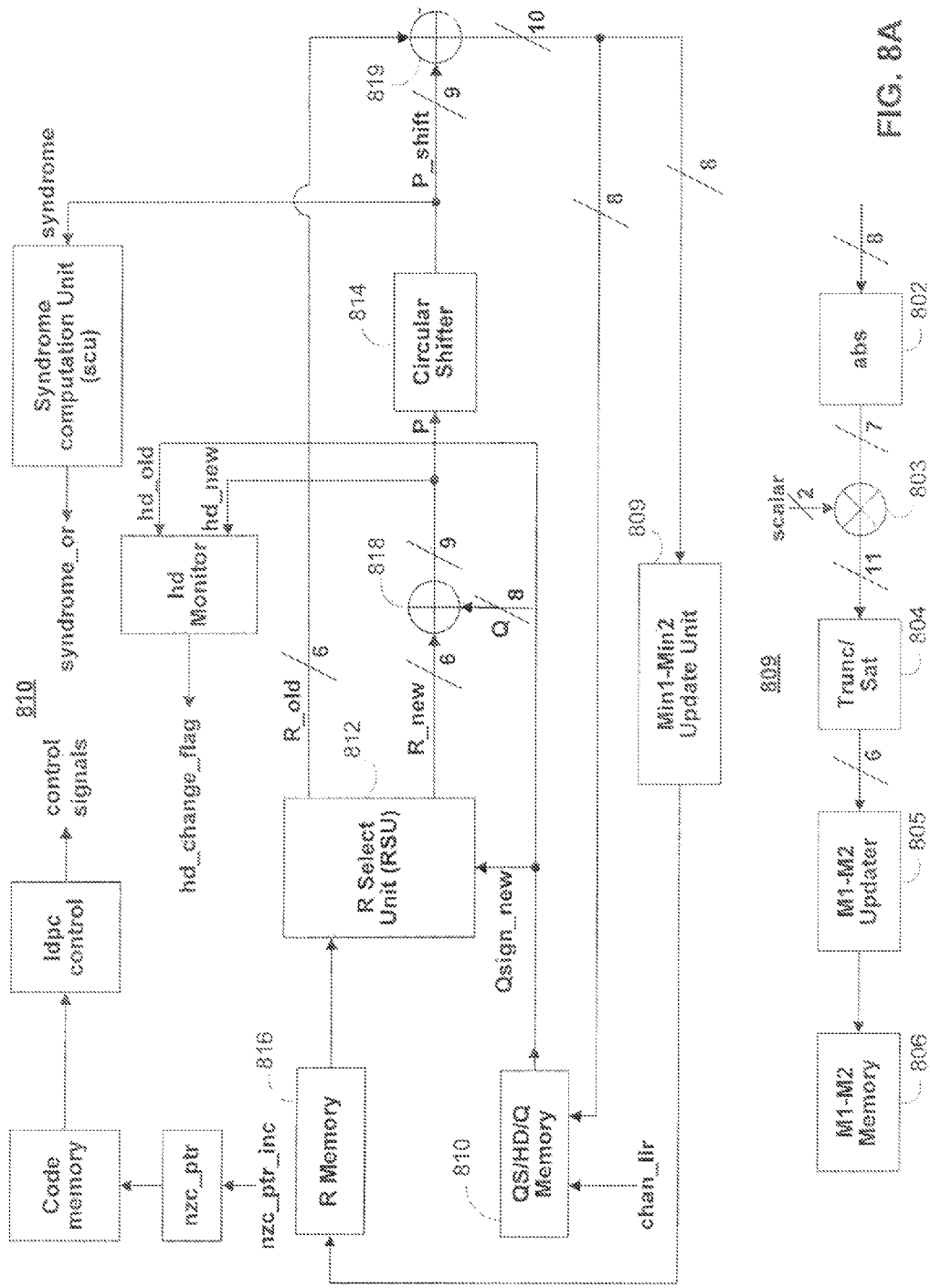
FIG. 8A shows a simplified block diagram of a layered LDPC decoder with a circular shifter in accordance with some embodiments.
Figure 8D:
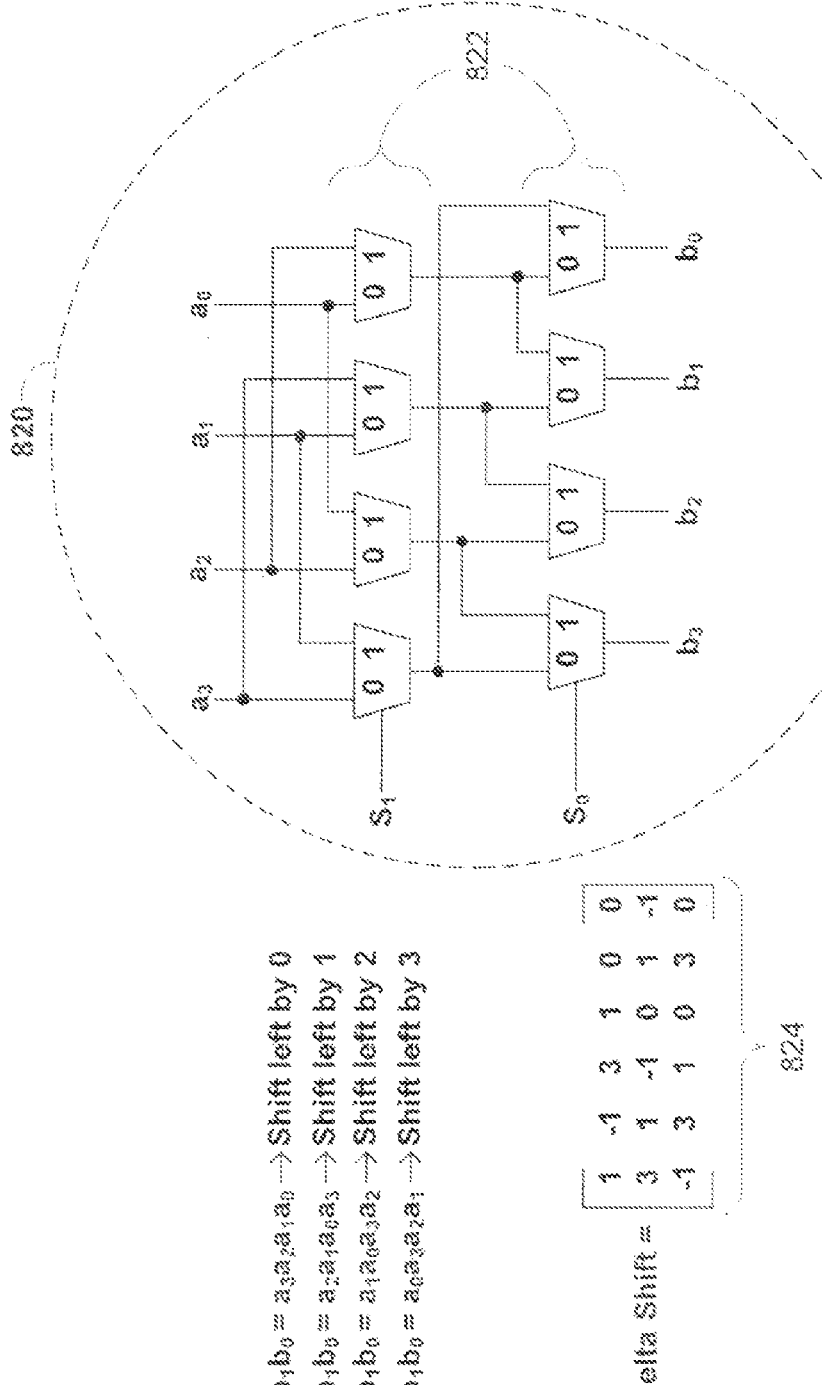
FIG. 8B shows a exemplary delta shift matrix and a circular shifter used in a layered LDPC decoder in accordance with some embodiments.

FIG. 8A shows a simplified block diagram of layered LDPC decoder 810 with circular shifter 814, for example, LDPC decoder 116 of FIG. 1, in accordance with some embodiments. Layered LDPC decoder 810 includes Q memory 810, R memory 816, R select unit 812, circular shifter 814, adder 818, subtractor 819, Min1–Min2 update unit 809, and additional components used to decode a received LDPC vector (e.g. received vector 114 of FIG. 1). Q memory 810 may be used for storing Q type messages and outputting the appropriate Q type message to adder 818. R memory 816 may be used for storing data used to derive R type messages (e.g. Min1, Min2, Min1Index, Min2Index, AccumulatedSign) and for outputting the appropriate data to R select unit 812. R select unit 812 may be used to output the R type message, $R_{new}$, to adder 818 after selecting the appropriate data used to derive the R type message from R memory 816. R select unit 812 may also be used to output the R type message, $R_{old}$, to subtractor 819 after selecting the appropriate data used to derive the R type message from R memory 816. Adder 818 may add the Q type message and the R type message, $R_{new}$, and compute the P type message, $P:=Q+R_{new}$, as discussed above. This P type message may be input to circular shifter 814. Circular shifter 814 may be used to cyclically shift the bits of the P type message it receives from adder 818 so that the bits may be aligned to the appropriate bits in the R type message, $R_{old}$ (e.g. R type message 622 of FIG. 6). Circular shifter 814 may then output the shifted version of the P type message to subtractor 819. Subtractor 819 may then compute a Q type message using $Q_{new}:=P-R_{old}$, as discussed above. This Q type message may then output to Q memory 810 to be stored. The Q type message may also be output to Min1–Min2 update unit 809 so that the values of Min1 and Min2 can be calculated and stored.

Min1-Min2 update unit 809 may include absolute value unit 802, multiplier 803, Truncation/Saturation unit 804, M1-M2 Updater 805, and M1-M2 Memory 806. Absolute Value Unit 802 may be used to take the absolute value of the received Q type message and to output this value to multiplier 803. Multiplier 803 may multiply the received value by a scalar value and output the result into Truncation/Saturation unit 804. Truncation/Saturation unit 804 may truncate the received value and output the result to M1-M2 Updater 805. M1-M2 Updater 805 may update the values of Min1 and Min2 as well as Min1Index, Min2Index, and AccumulatedSign based on the value it receives from Truncation/Saturation unit 804 and the previously stored values for Min1, Min2, Min1Index, Min2Index, and AccumulatedSign. M1-M2 Updater 805 may then output the result to M1-M2 Memory, which may buffer the result and may eventually output its contents to R Memory 816.

FIG. 8B shows exemplary delta shift matrix 824 and circular shifter 820 used in layered LDPC decoder 810 of FIG. 8A in accordance with some embodiments. A circular shifter (e.g. circular shifter 820) may be used in the layered decoding approach described FIG. 6 within LDPC decoder 116 of FIG. 1. For example, circular shifter may be used to cyclically shift the bits of P type messages so that they may be aligned to the appropriate bits in the R type message, $R_{old}$ (e.g. R type message 622 of FIG. 6). The determination of the amount by which to shift the bits of the P type messages may be made using a delta shift matrix associated with the QC-LDPC code being used (e.g. delta shift matrix 824).

A delta shift matrix, such as delta shift matrix 824 may be generated using a quasi-cyclic parity check matrix in a mother matrix representation associated with a QC-LDPC code (e.g. matrix 310 of FIG. 3). For example, a delta shift matrix may be generated by using the quasi-cyclic parity check matrix being used in the layered decoding approach described FIG. 6. Each entry in the delta shift matrix may represent a difference between the shift value corresponding to a current non-zero circulant entry in a column in the quasi-cyclic parity check matrix in a mother matrix representation and the shift value corresponding to the previous non-zero circulant entry in the same column. This may also be difference between the shift value corresponding a current group of check nodes to the processed/updated (e.g. grouped check nodes 522 of FIG. 5) and the shift value corresponding to the previous group of check nodes processed/updated (e.g. grouped check nodes 521 of FIG. 5) in the layered decoding approach described FIG. 6.

As discussed above, a quasi-cyclic parity check matrix associated with a QC-LDPC code may have circulants of size $S_c$. For each non-zero circulant entry in the quasi-cyclic parity check matrix in a mother matrix representation, the value for the entry at location (i,j) of the delta shift matrix, $D_{i,j}$, may be determined by the equation $D_{i,j}=mod(C_{i,j}-C_{pi,j}, S_c)$, where $C_{pi,j}$ is the (nearest) previous non-zero circulant in the $j^{th}$ column of the mother matrix. For each all-zero circulant entry in the quasi-cyclic parity check matrix in a mother matrix representation (i.e. an entry where $C_{i,j}=-1$), $D_{i,j}$ may be set equal to -1. A non-negative integer value in the $i^{th}$ row and $j^{th}$ column of the delta shift matrix may represent the additional amount that a circular shifter must shift the bits of a message while processing/updating the group of check nodes associated with the $i^{th}$ row of the quasi-cyclic parity check matrix and after processing/updating the check nodes associated with the previous non-zero circulant in the $j^{th}$ column of the quasi-cyclic parity check matrix. The maximum of all of the entries in a delta shift matrix may be $D_{max}$. This may represent the maximum shift amount that must be accommodated by a circular shifter to appropriately shift the bits of any message input to the circular shifter.

A circular shifter that may be used in decoding a QC-LDPC codeword may include $S_c$ inputs for an input message, $S_c$ outputs for an output message, and ceil($\log_2(D_{max})$) steps consisting of $S_c$ multiplexers for each step (i.e. a ceil($\log_2(D_{max})$)-step $S_c \times S_{cc}$ circular shifter, where the number of steps is set at the smallest integer not less than $\log_2(D_{max})$ using the ceiling function). In addition, the circular shifter may have ceil($\log_2(D_{max})$) inputs to determine the amount by which to shift the input message bits prior these bits being output as the bits of the output message. A reduction in the number of steps required to construct a circular shifter may allow for a reduction in the number of multiplexers and hence may also allow for a reduction in complexity of the circular shifter.

For example, circular shifter 820 is a 2-step 4×4 circular shifter constructed based on delta shift matrix 824 (with $D_{max}$=3) using multiplexers 822. Each step of circular shifter 820 contains four multiplexers. In addition, circular shifter 820 has two inputs, $S_c$ and $S_1$, which determine the amount by which the input message bits ($a_3$, $a_2$, $a_1$, and $a_0$) will be shifted prior to these bits being output as the output message bits ($b_3$, $b_2$, $b_1$, and $b_0$). In particular, $S_1$=0 and $S_0$=0 may imply a shift of the input message bits to the left by 0, $S_1$=0 and $S_0$=1 may imply a shift of the input message bits of the input message bits to the left by 2, and $S_1$=1 and $S_0$=1 may imply a shift of the input message bits to the left by 3. The amount of which the input message bits will be shifted may be determined based on the shift values in the quasi-cyclic parity check matrix in a mother matrix representation, associated with a QC-LDPC code.

The circulant size, $S_c$, and the maximum value of all of the entries in the delta shift matrix, $D_{max}$, may take large values. In this case, the circular shifter may require many steps (i.e. the circular shifter may be very complex). However, if a QC-LDPC code has a predefined or designed quasi-cyclic parity check matrix which produces a delta shift matrix with a small value for $D_{max}$, then the number of steps required to construct the circular shifter may be reduced. This may lead to a reduced-complexity circular shifter design which may also have easier timing closure. For example if $S_c$=512 and the maximum value of all of the entries in the delta shift matrix is 511, a ceil($\log_2(511)$)-step 512×512 circular shifter (i.e. a 9-step 512×512 circular shifter) may be required to appropriately shift each of the P type messages. However, if the maximum of all delta shift entries in the delta shift matrix is limited to a number smaller than 511, then some of the steps required to construct the circular shifter may be substantially eliminated.

Figure 9:
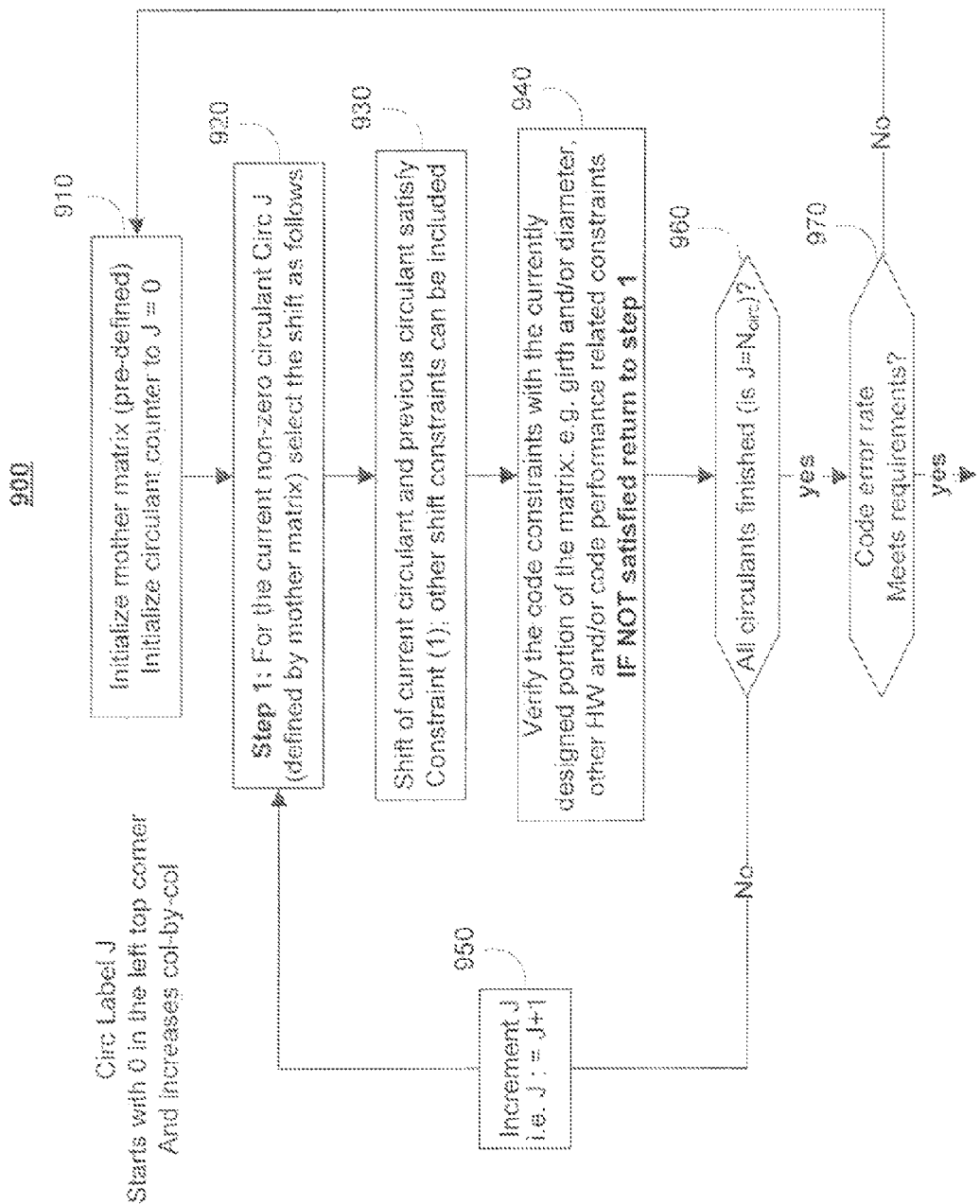
FIG. 9 shows a flowchart of a process for choosing the appropriate non-zero circulant shift entries in a quasi-cyclic parity check matrix in a mother matrix representation associated with a QC-LDPC code in accordance with some embodiments.

FIG. 9 shows a flowchart of a process for choosing the appropriate non-zero circulant shift entire in a quasi-cyclic parity check matrix in a mother matrix representation associated with a QC-LDPC code. Process 900 includes steps 910, 920, 930, 940, 950, 960, and 970. Process 900 may be used in modified versions of known algorithms used to design LDPC codes. For example, process 900 may be used to design parity check matrices for quasi-cyclic LDPC codes (discussed below), proto-graph LDPC codes, or multi-edge-type LDPC codes. In certain embodiments, process 900 may be designed to select the appropriate shift constrained non-zero circulant entries in a quasi-cyclic parity check matrix in a mother matrix representation with the locations of all of the non-zero circulant entries and with the circulant size, $S_c$, pre-defined. Process 900 may be used, for example, when the positions of non-zero circulants in the quasi-cyclic parity check matrix are fixed, while the shifts for each of these non-zero circulants are not fixed and can be chosen during the design. Process 900 may result in a quasi-cyclic parity check matrix in a mother matrix representation which has a corresponding delta shift matrix with a maximum delta shift value, $D_{max}$, that is less than a given threshold. As a result, this process may allow for the reduction in complexity of the circular shifter (e.g. circular shifter 820 of FIG. 8B) used in the layered decoding approach described in FIG. 6 within LDPC decoder 116 of FIG. 1. Specifically, the number of steps of multiplexers required to construct the circular shifter may depend on the maximum of all entries within the delta shift matrix, $D_{max}$. Reducing $D_{max}$ may lead to a reduced-complexity circular shifter design which may also have easier timing closure.

At step 910 the pre-defined mother matrix may be initialized. Furthermore, at step 910 a circulant counter, J, may be initialized to zero. Circulant counter, J, may keep track of the current non-zero circulant position on which process 900 is operating. Each increment of circulant counter, J, may increase the position in the quasi-cyclic parity check matrix, first by row and then by column starting from row 0 and column 0, on which process 900 is operating. In addition, circulant counter, J, may keep track of the total number of circulants that have already had their shift values selected in the quasi-cyclic parity check matrix.

At step 920, for the current non-zero circulant identified by the counter J, a shift may be selected at step 930.

At step 930, a shift for the circulant identified by circular counter J may be selected. This circulant, $C_{i,j}$, may be located in row i and column j of the quasi-cyclic parity-check matrix in mother-matrix representation. The selection of the shift for the circulant, $C_{i,j}$, may depend on the Constraint (1) defined as $0<\mod(C_{pi,j}-C_{i,j}, S_c)<Thresh<S_c$, where $C_{pi,j}$ is the (nearest) previous non-zero circulant in the $j^{th}$ column of the mother matrix. This constraint involves the current non-zero circulant, $C_{i,j}$, and the previous non-zero circulant in the same column, $C_{pi,j}$. This constraint ensures that the amount of shift between adjacent circulants in the same column may be limited by a maximum allowable threshold value, Thresh. The threshold value, Thresh, may define the maximum delta shift $D_{max}$. Other constraints may also be satisfied to determine the appropriate shift.

At step 940 the constraints associated with the QC-LDPC code may be verified with the currently designed portion of the quasi-cyclic parity check matrix. For example, the girth and/or the diameter associated with graph representation of the quasi-cyclic parity check matrix for the QC-LDPC code, and other hardware and/or QC-LDPC code performance constrains may be satisfied. If these constraints cannot be satisfied, process 900 may return to step 920.

At step 960, it may be determined if circulant counter J is equal to $N_{circ}$, the total number of circulants that must have their shift values determined in quasi-cyclic parity check matrix in a mother matrix representation associated with the QC-LDPC code (i.e. the maximum number of entries possible for the quasi-cyclic parity check matrix in a mother matrix representation). If J is equal to $N_{circ}$, then step 970 may be executed. IF, however, J does not equal $N_{circ}$, step 950 may be executed. At step 950, circulant counter J may be incremented by one, i.e. J:=J+1.

At step 970, it may be determined if the QC-LDPC code error rate (i.e., the BER/SER) of the QC-LDPC code associated with the designed quasi-cyclic parity check matrix satisfies particular requirements. If the code error rate satisfies particular requirements, then process 900 may be completed. If, however, the code error rate does not satisfy particular requirements, step 910 may be executed.

Figure 10:
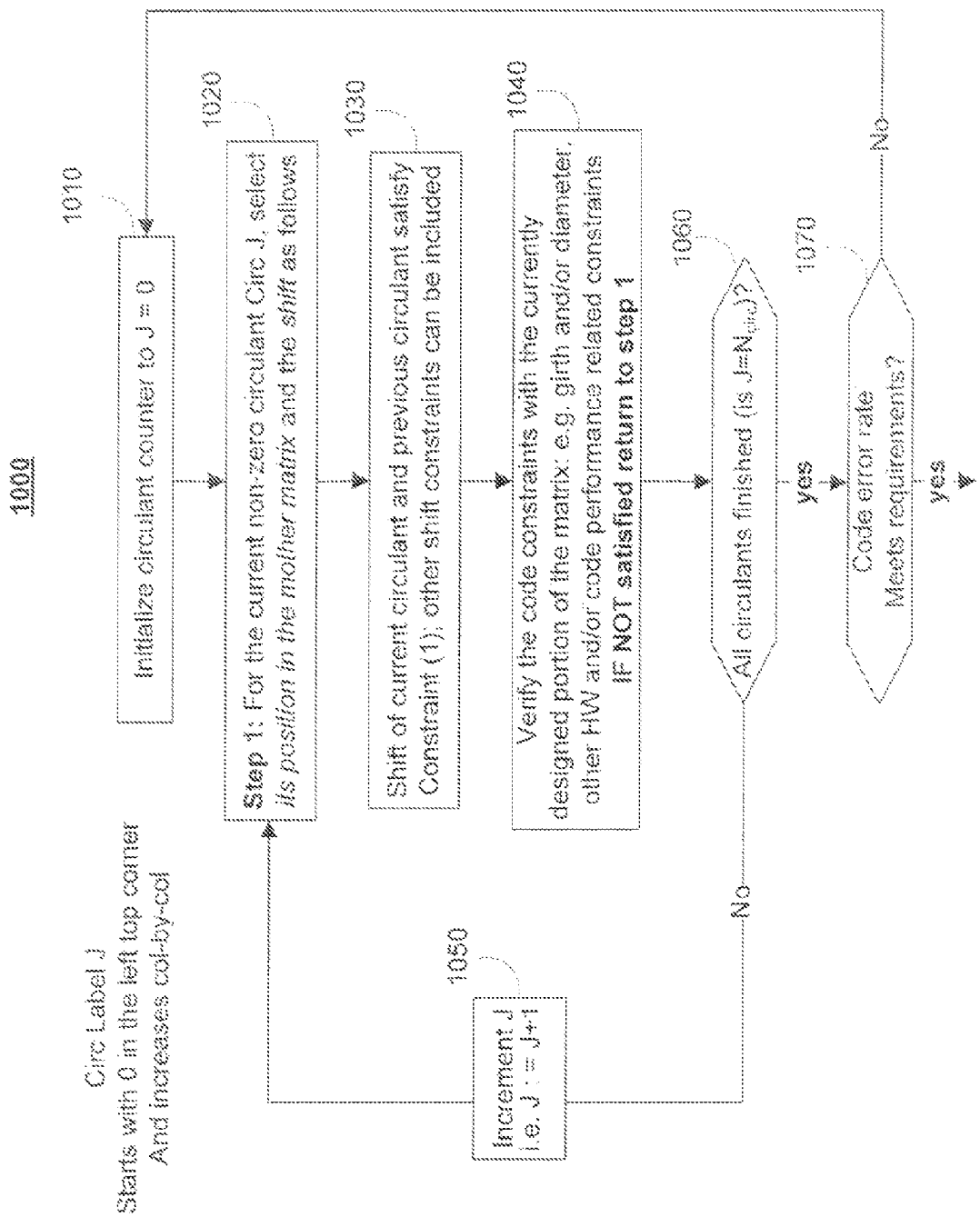
FIG. 10 shows a flowchart of a process for choosing the appropriate non-zero circulant shift entries and their positions in a quasi-cyclic parity check matrix in a mother matrix representation associated with a QC-LDPC code in accordance with some embodiments.

FIG. 10 shows a flowchart of a process for choosing the appropriate non-zero circulant shift entries and their positions in a quasi-cyclic parity check matrix in a mother matrix representation associated with a QC-LDPC code in accordance with some embodiments. Process 1000 includes steps 1010, 1020, 1030, 1040, 1050, 1060, and 1070. Process 1000 may be used in modified version of known algorithms (e.g. a progressive edge growth algorithm, in which circulants are designed one at a time) used to design LDPC codes. For example, process 1000 may be used to design parity check matrices for quasi-cyclic LDPC codes (discussed below), proto-graph LDPC codes, or multi-edge-type LDPC codes. In certain embodiments, process 1000 may be designed to select the appropriate shift constrained non-zero circulant entries and their positions in a quasi-cyclic parity check matrix in a mother matrix representation. The circulant size, $S_c$, of this parity check matrix may be pre-defined. Process 1000 may be used, for example, when both the positions and the shifts can be chosen during the design procedure. Process 1000 may result in a quasi-cyclic parity check matrix in a mother matrix representation which has a corresponding delta shift matrix with a maximum delta shift value, $D_{max}$, that is less than a given threshold. As a result, this process may allow for the reduction in complexity of the circular shifter (e.g. circular shifter 820 of FIG. 8B) used in the layered decoding approach described in FIG. 6 within LDPC decoder 116 of FIG. 1. Specifically, the number of steps of multiplexers required to construct the circular shifter may depend on the maximum of all entries within the delta shift matrix, $D_{max}$. Reducing $D_{max}$ may lead to a reduced-complexity circular shifter design which may also have easier timing closure.

At step 1010 a circulant counter, J, may be initialized to zero. Circulant counter, J, determines the current circulant on which process 1000 is operating. Circulant counter, J, may keep track of the total number of circulants that have already had their shift values selected in the quasi-cyclic parity check matrix.

At step 1020, the position and the shift for the current non-zero circulant identified by the circulant counter J are chosen based on the desired standard set of constraints (e.g. desired girth of the code) and the new constraint in step 1030.

At step 1030, a shift for the circulant identified by circulant counter J may be selected. This circulant, $C_{i,j}$, may be located in row i and column j of the quasi-cyclic parity-check matrix in mother-matrix representation. The selection of the shift for the circulant, $C_{i,j}$, may depend on the Constraint (1) defined as $0<\mod(C_{pi,j}-C_{i,j}, S_c)<Thresh<S_c$, where $C_{pi,j}$ is the (nearest) previous non-zero circulant in the $j^{th}$ column of the mother matrix. This constraint involves the current non-zero circulant, $C_{i,j}$, and the previous non-zero circulant in the same column, $C_{pi,j}$. This constraint ensures that the amount of shift between adjacent circulants in the same column may be limited by a maximum allowable threshold value, Thresh. The threshold value, Thresh, may define the maximum delta shift $D_{max}$. Other constraints may also be satisfied to determine the appropriate shift.

At step 1040 the constraints associated with the QC-LDPC code may be verified with the currently designed portion of the quasi-cyclic parity check matrix. For example, the girth and/or the diameter associated with graph representation of the quasi-cyclic parity check matrix for the QC-LDPC code, and other hardware and/or QC-LDPC code performance constrains may be satisfied. If these constraints cannot be satisfied, process 1000 may return to step 1020.

At step 1060, it may be determined if circulant counter J is equal to $N_{circ}$, the total number of circulants that must have their shift values determined in quasi-cyclic parity check matrix in a mother matrix representation associated with the QC-LDPC code (i.e. the maximum number of entries possible for the quasi-cyclic parity check matrix in a mother matrix representation). If J is equal to $N_{circ}$, then step 1070 may be executed. If, however, J does not equal $N_{circ}$, step 1050 may be executed. At step 1050, circulant counter J may be incremented by one, i.e. J:=J+1.

At step 1070, it may be determined if the QC-LDPC code error rate (i.e., the BER/SER) of the QC-LDPC code associated with the designed quasi-cyclic parity check matrix satisfies particular requirements. If the code error rate satisfies particular requirements, then process 1000 may be completed. If, however, the code error rate does not satisfy particular requirements, step 1010 may be executed.

Figure 11:
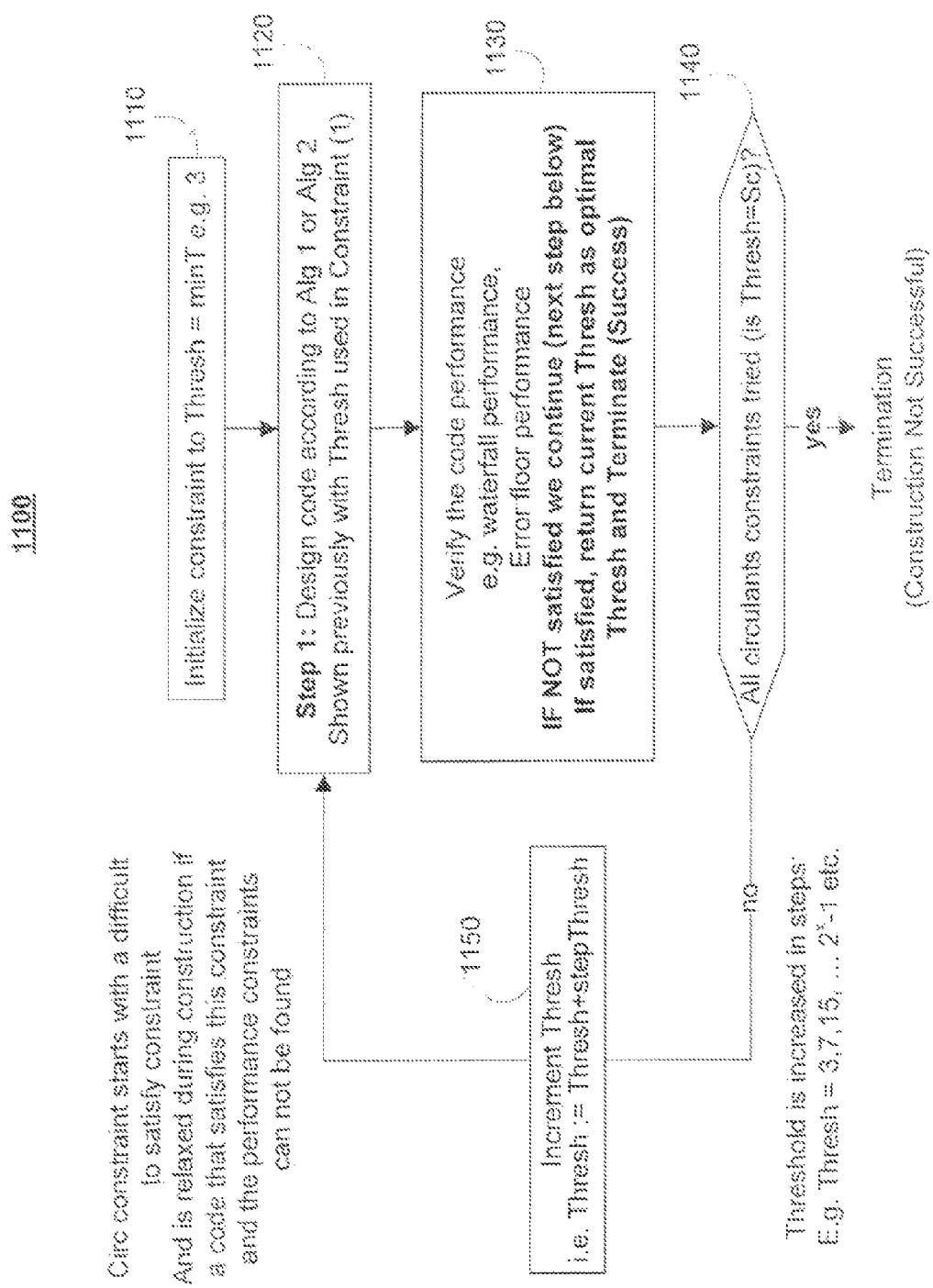
FIG. 11 shows a flowchart of a process for designing a QC-LDPC code which satisfies particular code performance constraints in accordance with some embodiments.

FIG. 11 shows a flowchart of a process for designing a QC-LDPC code which satisfies particular code performance constraints in accordance with some embodiments. Process 1100 includes steps 1110, 1120, 1130, 1140, and 1150. In certain embodiments, process 1100 may be designed to use process 900 of FIG. 9 or process 1000 of FIG. 10 to design a QC-LDPC code by using these processes to create a quasi-cyclic parity check matrix in a mother matrix representation for the QC-LDPC code. Process 1100 may then test the resulting QC-LDPC code to determine if particular code performance targets have been met. Therefore, process 1100 may result in a quasi-cyclic parity check matrix in a mother matrix representation which has a corresponding delta shift matrix with a maximum delta shift value, $D_{max}$, that is less than a given threshold. As a result, this process may allow for the reduction in complexity of the circular shifter (e.g. circular shifter 820 of FIG. 8B) used in the layered decoding approach described in FIG. 6 within LDPC decoder 116 of FIG. 1. Specifically, the number of steps of multiplexers required to construct the circular shifter may depend on the maximum of all entries within the delta shift matrix, $D_{max}$. Reducing $D_{max}$ may lead to a reduced-complexity circular shifter design which may also have easier timing closure. Process 1100 may also allow the LDPC performance curve 700 of FIG. 7 of the designed QC-LDPC code to have particular properties.

At step 1110 the threshold value, Thresh, as discussed in the description of step 930 of FIG. 9 and step 1030 of FIG. 10, may be initialized to min T, where min T≦$S_c$. Initially, min T is set to a low value (i.e. a very low initial value for Thresh), which typically gives a difficult to satisfy constraint in design step 1120.

At step 1120, process 900 of FIG. 9 or process 1000 of FIG. 10 may be employed to design a QC-LDPC code by designing the associated quasi-cyclic parity check matrix in a mother matrix representation. If process 900 of FIG. 9 is used, at step 930, the value for Thresh chosen at step 910 may be used in the constraint 0<mod($C_{pi,j}$–$C_{i,j}$, $S_c$)<Thresh<$S_c$. If process 1000 of FIG. 10 is used, at step 1030, the value for Thresh chosen at step 1110 may be used in the constraint 0<mod($C_{pi,j}$–$C_{i,j}$, $S_c$)<Thresh<$S_c$. Either process 900 or process 1000 may be used to design a quasi-cyclic parity check matrix in a mother matrix representation, one circulant at a time and also one column at a time. The constraint used by either of these processes may be made very stringent and also may depend on the desired error rate of the QC-LDPC code associated with the quasi-cyclic parity check matrix being designed.

At step 1130 the code performance of the QC-LDPC code designed at step 1020 may be verified to satisfy particular properties. For example, the performance of the designed QC-LDPC code in waterfall region 702 of FIG. 7 and in error floor region 704 of FIG. 7 of LDPC performance curve 700 of FIG. 7 for the designed QC-LDPC code may be verified to satisfy particular properties. If the QC-LDPC code's performance does not satisfy the particular properties, step 1140 may be executed. If, however, the QC-LDPC code's performance does satisfy the particular properties, the value of Thresh may be returned as the optimal value of Thresh and process 1100 may be terminated.

At step 1140 it may be determined whether Thresh=$S_c$ (i.e. all circulant constraints have been tried in the inequality 0<mod($C_{pi,j}$–$C_{i,j}$, $S_c$)<Thresh<$S_c$, in step 1120). If Thresh=$S_c$ process 1100 may be unsuccessful at constructing a QC-LDPC code with a LDPC code performance which satisfies particular properties and process 1100 may then terminate. If Thresh does no equal $S_c$, then step 1150 may be executed.

At step 1150, the value of Thresh may be incremented (i.e. Thresh:=Thresh+stepThresh). The threshold value, Thresh, may be incremented. For example, Thresh may first be set at 3 and then subsequently set at 7 and then set at 15 and in general, $2^x-1$, where x+2 is the number of times that step 1150 has been executed.

By using the threshold value based constraint, described above, process 1100 may be used to design a QC-LDPC code with varying LDPC code performance properties. For example, process 1100 may be used to design a QC-LDPC code for which the performance of the code is unchanged in the waterfall region of the code's performance curve. As another example, process 1100 may be used to design a QC-LDPC code which has an acceptable 0.1 dB loss in the waterfall region of the code's performance curve. AS another example, process 1100 may be used to design a QC-LDPC code for which the performance of the code is unchanged in the error floor region of the code's performance curve. As yet another example, process 1100 my be used to design a QC-LDPC code which has an acceptable loss in the error floor region of the code's performance curve.

Figure 12:
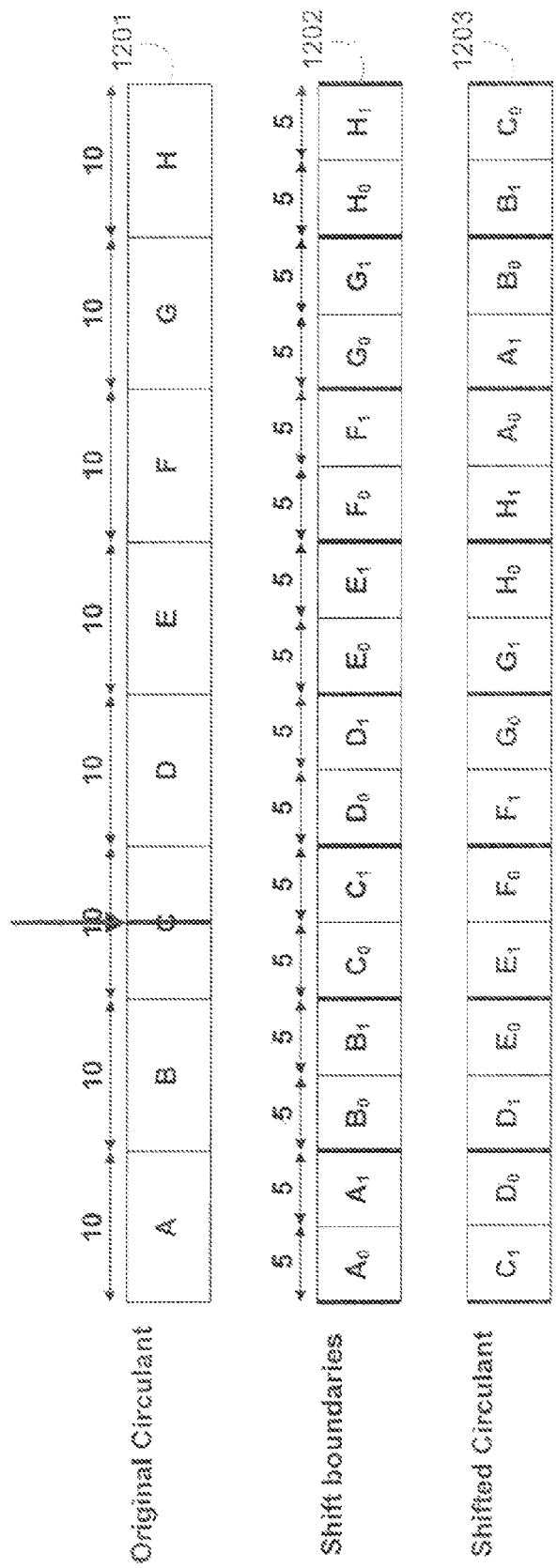
FIG. 12 shows a graphical illustration of the initial shifting of a log-likelihood-ratio messages (LLRs) done to all LLRs prior to the start of the decoding process in accordance with some embodiments.

FIG. 12 shows a graphical illustration of the initial shifting of log-likelihood-ratio (LLR) messages 1201 done to all LLRs prior to the start of the decoding process in accordance with some embodiments. LLR messages 1201 may be the initial messages sent to grouped variable nodes associated with a circulant of a quasi-cyclic parity check matrix in a mother matrix representation. This message may have been sent by, for example, a channel detector. Prior to the start of the decoding process, this message may have to be appropriately shifted so that the computation and subsequent shifting of P or Q type messages is correct. The amount that the LLR messages must be shifted may be determined by the difference in shifts between the first non-zero circulant in the column associated with the grouped variable nodes to which the LLR messages are sent and the previous non-zero circulant in the same column. LLR messages may be sent from, for example, a channel detector to a layered LDPC decoder in segments smaller than circulant size, $S_c$. LLR messages may be sent in this manner because of the bandwidth constraints in the channel between a channel detector and a layered LDPC decoder.

For example, there are $S_c$=100 messages in LLR messages 1201, each for a different variable node in a group of variable nodes. LLR messages 1201 may need to be shifted by 25. In this case, the LLRs prior to the 26$^{th}$ LLR in LLR messages 1201 must be deleted from the beginning of LLR messages 1201 and moved to the end of LLR messages 1201. Due to bandwidth constraints, only 10 LLR messages may be sent to the layered LDPC decoder per clock cycle. Segments A through H may represent each of these 10 LLR message segments within LLR messages 1201.

The appropriate shifting of LLR messages 1201 may be implemented in one of two ways. First, all 100 messages in LLR messages 1201 may be shifted by 25 and then sent to the LDPC decoder 10 LLR messages at a time. This approach, however, may require that a ceil($\log_2(100)$)–step 100×100 circular shifter be used. However, another approach may be used which does not require a circular shifter of such a high complexity. For example, shift boundaries may first be determined for LLR messages 1201. Since LLR messaged 1201 require a shift of 25, each segment of LLR messages 1201 may be further divided into segments of size 25 modulo 10 (i.e. shift modulo segment size) and 10-25 modulo 10 (i.e. segment size—shift modulo segment size).

LLR messages with shift boundaries 1202 shows the divisions of segments A through H into segments $A_0, A_1, B_0, B_1, C_0, C_1, D_0, D_1, E_0, E_1, F_0, F_1, G_0, G_1, H_0,$ and $H_1$. To appropriately shift LLR messages 1201 by 25, the segments of LLR messages with shift boundaries 1202 may be accessed from memory in the appropriate order and sent to the layered LDPC decoder 10 LLR messages per clock cycle. For example, segment $C_1$ and $D_0$ may be sent in the first clock cycle, followed by $D_1$ and $E_0$ in the second clock cycle, $E_1$ and $F_0$ in the third clock cycle, $F_1$ and $G_0$ in the fourth clock cycle, $G_1$ and $H_0$ in the fifth clock cycle, $H_1$ and $A_0$ in the sixth clock cycle, $A_1$ and $B_0$ in the seventh clock cycle, and $B_1$ and $C_0$ in the eighth clock cycle. The result of this may be shifted LLR messages 1203, which is the appropriately shifted version of LLR messages 1201.

Those skilled in the art will appreciate that the invention can be practiced by other than the described embodiments, which are presented for the purpose of illustration rather than of limitation.

What is claimed is:

1. A circular shifter for shifting bits of an input message in a low density parity check (LDPC) decoder, the circular shifter comprising:
   data inputs to receive the input message;
   shifting circuitry comprising circuitry for shifting the bits of the input message up to a maximum threshold, wherein entries of a quasi-cyclic parity check matrix are determined based on the maximum threshold that is less than a circulant size of the quasi-cyclic parity check matrix;
   control inputs that select an amount of shift to be applied to the bits of the input message by the shifting circuitry based on the entries in the quasi-cyclic parity check matrix; and
   data outputs that output the input message shifted by the selected amount of shift.

2. The circular shifter of claim 1, wherein each the of determined entries of the quasi-cyclic parity check matrix are selected based on a difference, between a selected entry of the quasi-cyclic parity check matrix and an adjacent entry of the quasi-cyclic parity check matrix, being less than the maximum threshold.

3. The circular shifter of claim 2, wherein the determined entries of the quasi-cyclic parity check matrix are selected to satisfy a selected code error rate requirement.

4. The circular shifter of claim 3, wherein the selected code error rate requirement requires that the entries of the quasi-cyclic parity check matrix are selected to satisfy a predetermined Bit Error Rate (BER).

5. The circular shifter of claim 3, wherein the selected code error rate requirement requires that the entries of the quasi-cyclic parity check matrix are selected to satisfy a predetermined Sector Error Rate (SER).

6. The circular shifter of claim 1, wherein the entries in the quasi-cyclic parity check matrix are constrained by $0 < \mod(C_{mod(i+1, \ dv(j))),j} - C_{i,j}, \ S_c) < \text{Thresh} < S_c$, wherein Thresh is equal to the maximum threshold, dv(j) is a degree of column j, $C_{i,j}$ is the entry in the quasi-cyclic parity check matrix at the i-th row and j-th column, and $S_c$ is equal to the circulant size of the quasi-cyclic parity check matrix.

7. The circular shifter of claim 1, wherein the shifting circuitry comprises a predetermined number of shifting steps, wherein the predetermined number is chosen based on a difference between entries in the quasi-cyclic parity check matrix in a mother matrix representation.

8. The circular shifter of claim 7, wherein the predetermined number of shifting steps is chosen based on a maximum of all entries of a delta shift matrix generated based on the quasi-cyclic parity check matrix in the mother matrix representation.

9. A method for shifting the bits of an input message based on a low density parity check (LDPC) code, the method comprising:
   receiving the input message;
   selecting, using circular shifter circuitry, an amount of shift to be applied to the bits of the input message based on entries in a quasi-cyclic parity check matrix that are determined based on a maximum threshold that is less than a circulant size of the quasi-cyclic parity check matrix, wherein the amount of shift is less than the maximum threshold; and
   outputting the input message shifted by the selected amount of shift.

10. The method of claim 9, wherein the determined entries of the quasi-cyclic parity check matrix are selected based on a difference, between a selected entry of the quasi-cyclic parity check matrix and an adjacent entry of the quasi-cyclic parity check matrix, being less than the maximum threshold.

11. The method of claim 10, wherein the determined entries of the quasi-cyclic parity check matrix are selected to satisfy a selected code error rate requirement.

12. The method of claim 11, wherein the selected code error rate requirement requires that the entries of the quasi-cyclic parity check matrix are selected to satisfy a predetermined Bit Error Rate (BER).

13. The method of claim 11, wherein the selected code error rate requirement requires that the entries of the quasi-cyclic parity check matrix are selected to satisfy a predetermined Sector Error Rate (SER).

14. The method of claim 9, wherein the determined entries of the quasi-cyclic parity check matrix are constrained by $0 < \mod(C_{(mod(i+1, \ dv(j))),j} - C_{i,j}, \ S_c) < \text{Thresh} < S_c$, wherein Thresh is equal to the maximum threshold, dv(j) is a degree of column j, $C_{i,j}$ is the entry in the quasi-cyclic parity check matrix at the i-th row and j-th column, and $S_c$ is equal to a circulant size of the quasi-cyclic parity check matrix.

15. The method of claim 9, wherein the shifting circuitry comprises a pre-determined number of shifting steps, wherein the pre-determined number is chosen based on a difference between entries in the quasi-cyclic parity check matrix in a mother matrix representation.

16. The method of claim 15, wherein the predetermined number of shifting steps is chosen based on a maximum of all entries of a delta shift matrix generated based on the quasi-cyclic parity check matrix in the mother matrix representation.

17. A data storage system, the data storage system comprising:
   input circuitry for providing an input message generated based on a low density party check (LDPC) code; and shifting circuitry comprising circuitry for shifting the bits of the input message up to a maximum threshold, wherein entries of a quasi-cyclic parity check matrix are determined based on the maximum threshold that is less than a circulant size of the quasi-cyclic parity check matrix;

control input circuitry that select an amount of shift to be applied to the bits of the input message by the shifting circuitry based on the entries in the quasi-cyclic parity check matrix; and data output circuitry for outputting the input message shifted by the selected amount of shift.

18. The data storage system of claim 17, wherein each the of determined entries of the quasi-cyclic parity check matrix are selected based on a difference between a selected entry of the quasi-cyclic parity check matrix and an adjacent entry of the quasi-cyclic parity check matrix being less than the maximum threshold which is less than the circulant size of the quasi-cyclic parity check matrix.

19. The data storage system of claim 17, wherein the determined entries of the quasi-cyclic parity check matrix based on the maximum threshold are selected to satisfy a selected code error rate requirement.

20. The data storage system of claim 17, wherein the entries in the quasi-cyclic parity check matrix are constrained by $0 < \mod(C_{(\mod(i+1, \, dv(j))), j} - C_{i,j}, \, S_c) < \text{Thresh} < S_c$, wherein Thresh is equal to the maximum threshold, $dv(j)$ is a degree of column j, $C_{i,j}$ is the entry in the quasi-cyclic parity check matrix at the i-th row and j-th column, and $S_c$ is equal to a circulant size of the quasi-cyclic parity check matrix.

* * * * *